United States Patent [19]

Lidow

[11] 4,414,560
[45] Nov. 8, 1983

[54] FLOATING GUARD REGION AND PROCESS OF MANUFACTURE FOR SEMICONDUCTOR REVERSE CONDUCTING SWITCHING DEVICE USING SPACED MOS TRANSISTORS HAVING A COMMON DRAIN REGION

[75] Inventor: Alexander Lidow, Manhattan Beach, Calif.

[73] Assignee: International Rectifier Corporation, Los Angeles, Calif.

[21] Appl. No.: 207,126

[22] Filed: Nov. 17, 1980

[51] Int. Cl.³ ............................................. H01L 29/747
[52] U.S. Cl. ........................................ 357/39; 357/23; 357/41; 357/52; 357/53; 357/86
[58] Field of Search ...................... 357/23, 38, 39, 41, 357/86, 52, 53

[56] References Cited

U.S. PATENT DOCUMENTS

| 4,199,774 | 4/1980 | Plummer | 357/23 |
| 4,286,279 | 8/1981 | Hutson | 357/39 |
| 4,331,884 | 5/1982 | Svedberg | 357/38 |

OTHER PUBLICATIONS

A. Lebedev, "Analysis of Process in Multilayer Semiconductor Structures of the N-P-N-P-N-P Type", Physics of P-N JCNS. and Semiconductor Devices, 2nd Ed., London, 1976, pp. 321–329.

Primary Examiner—Joseph E. Clawson, Jr.
Attorney, Agent, or Firm—Ostrolenk, Faber, Gerb & Soffen

[57] ABSTRACT

A high-voltage, high current switching device is formed of two D-MOS transistors which are merged together to have a common drain and insulated metal gate. At the time P-type regions for the two D-MOS transistors are formed, a floating P-type region is formed between them. A field plate is used in combination with the floating guard region.

5 Claims, 4 Drawing Figures

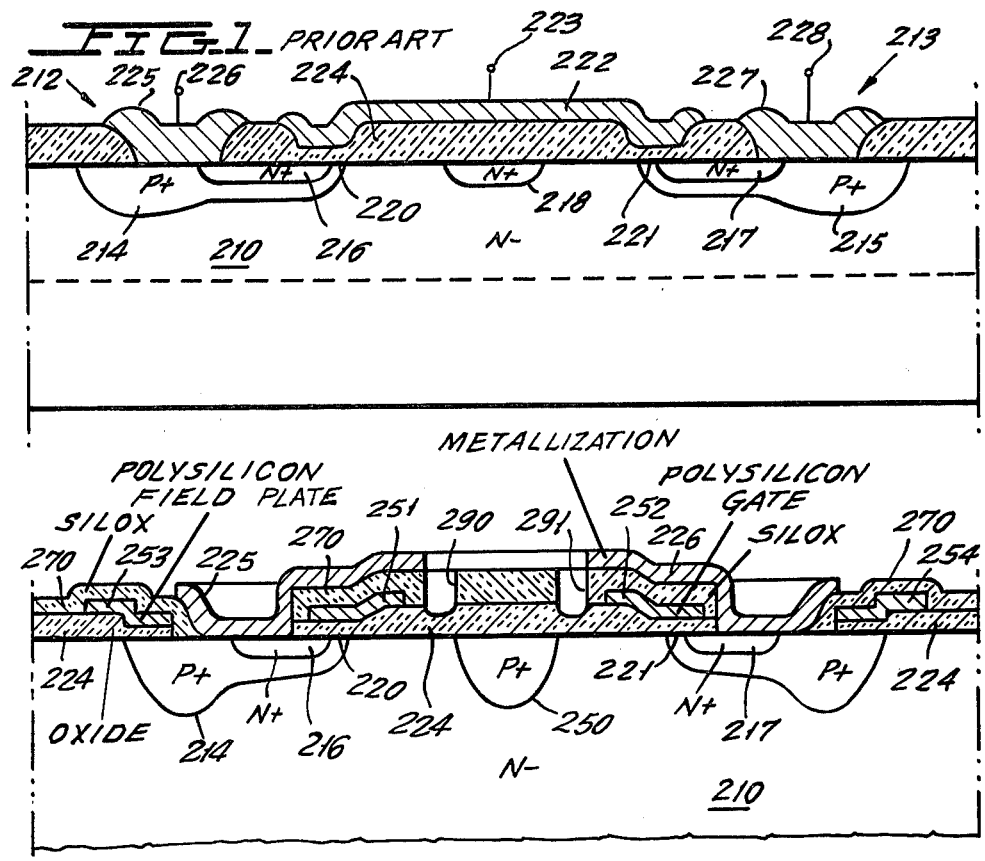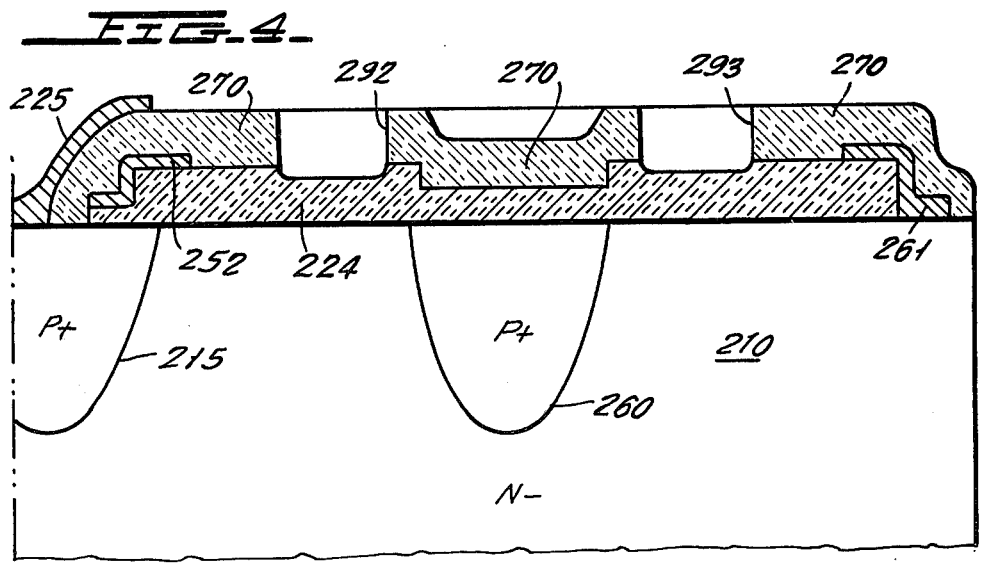

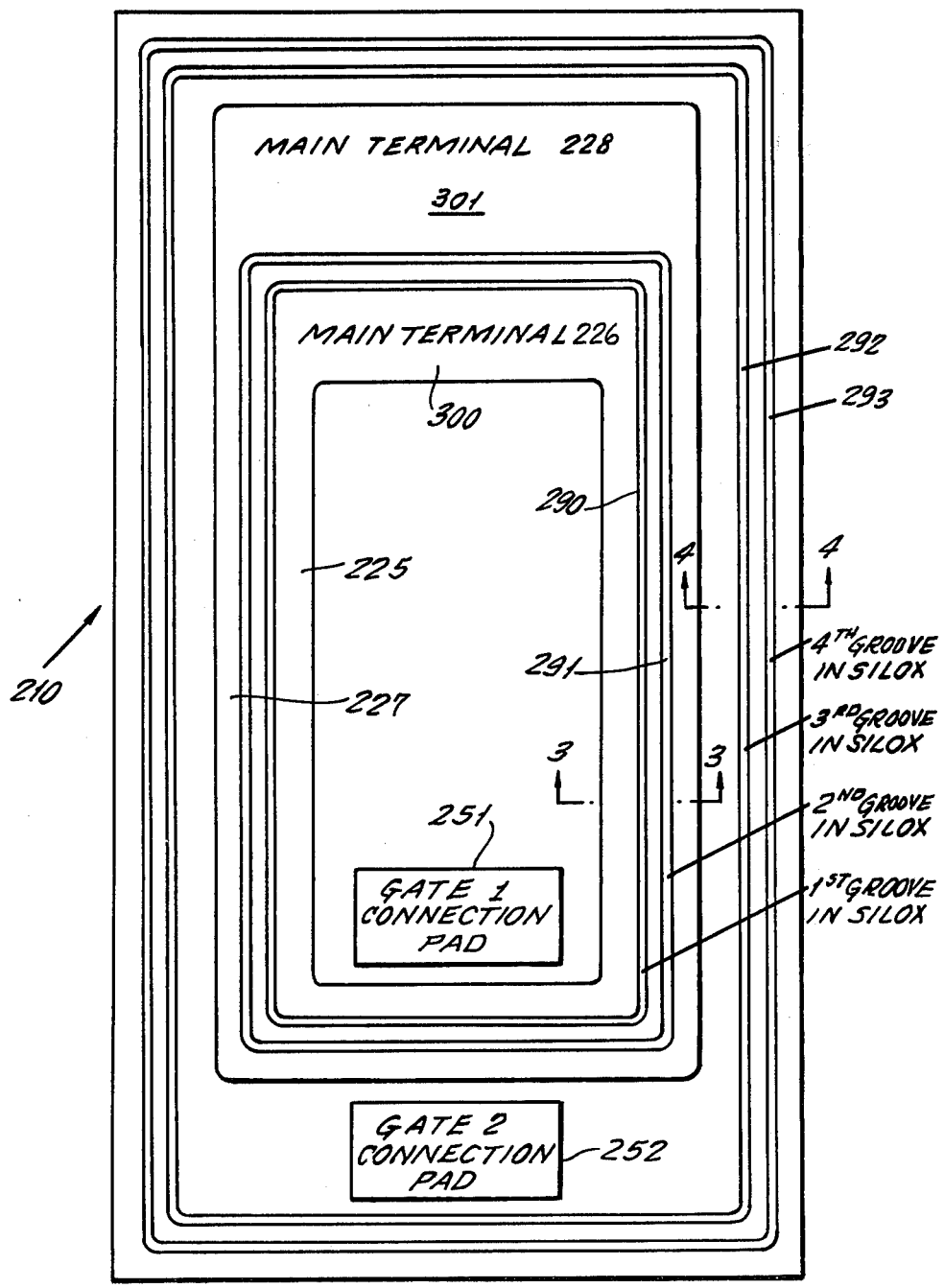

4,414,560

FLOATING GUARD REGION AND PROCESS OF MANUFACTURE FOR SEMICONDUCTOR REVERSE CONDUCTING SWITCHING DEVICE USING SPACED MOS TRANSISTORS HAVING A COMMON DRAIN REGION

RELATED APPLICATIONS

This application is related to copending applications Ser. No. 38,662, filed May 14, 1979, in the name of Alexander Lidow et al, entitled *PLURAL POLYGON SOURCE PATTERN FOR MOSFET*, now abandoned, and its continuation application, Ser. No. 243,544, filed Mar. 13, 1981; Ser. No. 178,689, filed Aug. 18, 1980, in the name of Alexander Lidow et al, entitled *PROCESS FOR MANUFACTURE OF HIGH POWER MOSFET WITH LATERALLY DISTRIBUTED HIGH CARRIER DENSITY BENEATH THE GATE OXIDE;* Ser. No. 207,123, filed Nov. 17, 1980, in the name of Thomas Herman et al, entitled *IMPROVED PLANAR STRUCTURE FOR HIGH VOLTAGE SEMICONDUCTOR DEVICES;* and Ser. No. 207,124, filed Nov. 17, 1980, in the name of Thomas Herman et al, entitled *COMPOSITE METAL AND POLYSILICON FIELD PLATE STRUCTURE FOR HIGH VOLTAGE SEMICONDUCTOR DEVICES*, all of which are assigned to the assignee of the present invention.

BACKGROUND OF THE INVENTION

This invention relates to semiconductor switching devices, and more specifically relates to a novel structure and process of manufacture of a high speed switching device which employs two D-MOS type transistors which are merged together to have a common gate.

High power switching devices using MOS gate techniques are well known. One device, which is improved by the present invention, is the device known as a TRIMOS type device (an MOS controlled triac). The TRIMOS device consists generally of two D-MOS transistors which are merged together and employ a common drain and have insulated metal gates. The TRIMOS device is described in *ELECTRONIC DESIGN* 4, Feb. 15, 1978, pages 32 to 34, in an article entitled *MOS-CONTROLLED TRIAC COMBINED LOW INPUT POWER, HIGH OUTPUT POWER*. This same device is also described in U.S. Pat. No. 4,199,774, entitled *MONOLITHIC SEMICONDUCTOR SWITCHING DEVICE*, in the name of James D. Plummer.

In manufacturing the above device, it has been common to use self-aligned diffusion techniques for the formation of the two transistors. However, a relatively high conductivity region of the same type as the substrate is formed between the two conduction channels centered beneath their gate electrodes to prevent inversion of the otherwise relatively lightly doped material when the gate voltages are appropriate. The inversion of this intermediate layer would interfere with the correct operation of the TRIMOS device.

The formation of this N+ region required a separate diffusion and separate alignment step from the diffusion and alignment used in the manufacture of the transistor portions of the structure. Consequently, the device is very difficult to manufacture and is relatively expensive. Furthermore, the electric field surrounding the D-MOS transistors curves sharply within the device body, thus limiting the device to withstand more than a relatively low reverse voltage. For example, the devices have not been able to withstand more than about 200 volts.

BRIEF DESCRIPTION OF THE INVENTION

In accordance with the present invention, the inversion-prevention region previously disclosed for TRIMOS structures is replaced by a region of conductivity type opposite to that of the substrate, and acts as a floating guard region. The gate electrode is separated into two sections disposed on opposite sides of said guard body. The device is now capable of operation at higher reverse voltages because the electric field distribution is more gradually curved within the body of the substrate and can withstand higher reverse voltages.

As a further advantage of the use of a floating guard region, it now becomes possible to introduce the floating guard ring between the two D-MOS transistors at the same time that the D-MOS transistors are formed, using self-aligned diffusion techniques for making all junctions. Consequently, the floating guard region is formed simultaneously with the transistors and no separate diffusion or alignment is necessary to form the subsidiary regions. Consequently, the device is more easily fabricated and has improved reverse voltage characteristics.

As a further feature of the invention, the gates of the two transistors are formed of polysilicon which is overlaid with an oxide layer followed by the main electrodes, thus forming a composite field plate structure for the gate polysilicon and main electrode to terminate the main electrode in such a manner that the electric fields beneath the gates will be gradually curved within the silicon substrate. The gradual curvature of the electric fields will permit the device to withstand higher reverse voltage than if the main electrodes were simply sharply terminated in the prior art manner.

It is to be noted that the process steps used in manufacturing the device of the invention correlate generally to those used in application Ser. Nos. 38,662 and 243,544, referred to above, which are incorporated herein as an integral part of this application.

BRIEF DESCRIPTION OF THE DRAWINGS

FIG. 1 shows a prior art type of TRIMOS device which is a semiconductor switching device using spaced MOS transistors having a common drain region.

FIG. 2 is a top view of a TRIMOS device which incorporates the feature of the present invention.

FIG. 3 is a cross-sectional view of FIG. 2 taken across the section line 3—3 in FIG. 2 and illustrates spaced gaps in the silox coating.

FIG. 4 is a cross-sectional view of FIG. 2 taken across the section line 4—4 in FIG. 2 and illustrates gaps in the silox layer at the outer periphery of the device on opposite sides of the guard ring.

DETAILED DESCRIPTION OF THE DRAWINGS

FIGS. 1 through 4 illustrate a TRIMOS type device which is a semiconductor switching device using spaced MOS transistors having a common drain region. The TRIMOS device is described in aforementioned U.S. Pat. No. 4,199,774 in the name of James D. Plummer, entitled *MONOLITHIC SEMICONDUCTOR SWITCHING DEVICE*.

Referring to FIG. 1, the prior art TRIMOS device consists of a substrate region 210 which is of lightly doped N type silicon. The lightly doped substrate 210 contains two D-MOS type transistors 212 and 213 which consist of P+ regions 214 and 215, respectively; N+ regions 216 and 217 which are wholly enclosed within the P+ regions 214 and 215, respectively; and a high conductivity N+ type region 218 which is disposed between the two transistors 212 and 213. Regions 214 and 216 define a first conduction channel 220 and regions 215 and 217 define a second conduction channel 221. Channels 220 and 221 can be inverted by the common gate electrode 222 which has a terminal 223 and which is spaced from the upper substrate 210 by the silicon dioxide layer 224. Any suitable insulation layer can be used.

A first main electrode 225, having terminal 226, is then connected to the P+ region 214 and N+ region 216. Electrode 225 may be considered either the source or drain electrode of the transistor 212. The other electrode consists of the body of the substrate 210 disposed between transistors 212 and 213.

Transistor 213 has a main electrode 227 which has a terminal 228. Electrode 227 is connected to the P+ region 215 and the N+ region 217. The N+ regions 216 and 217 define, for example, the source regions of each of transistors 212 and 213. The drain region of each of transistors 212 and 213 is that region of the substrate 210 which is disposed between the channels 220 and 221.

The N+ region 218 is disposed between the channels 220 and 221 and beneath the gate 222. The N-substrate could be inverted when suitable voltages are connected to the gate electrode 222. By making the region 218 relatively highly conductive, the region will not be inverted by gate 222.

The operation of the device of FIG. 1 is described in detail in the above-noted U.S. Pat. No. 4,199,774. Briefly stated, for gate potentials above the threshold value, there will be three distinct regions of operation. In the low level region, and if the terminal 228 is less than about 1.5 volts above the potential of terminal 226, both channels 220 and 221 will be inverted and both transistors 212 and 213 will operate in their linear regions. Thus, all anode-to-cathode current will be carried by electrons at the surface of the device. This device will then exhibit low on-resistance current-voltage characteristics similar to that of two short channel D-MOS transistors in series. By way of example, the channel length of channels 220 and 221 may be about 2.5 microns for each.

In an intermediate level of operation, and with an increasing voltage on the terminal 228, the junction between region 215 and substrate 210 becomes forward-biased and serves as the emitter of a wide base PNP lateral transistor. The junction-injected holes will drift and diffuse to the P+ region 214 where they will be collected to contribute an added component to the device current. The result is an increase in transconductance.

As the PNP collector current increases with anode or gate potential, its flow through the resistive region within and extending along P+ region 214 raises the potential of the P+ region beneath the gate 222 and the channel 220 begins to turn on the vertical NPN transistor consisting of regions 216, 214 and 210 which is inherent in the D-MOS structure. This NPN device and the PNP device form a four-layer diode which regeneratively switches when the alphas of the PNP and NPN transistors add up to one. In its on-state then, the TRIMOS device exhibits a dynamic resistance, for example, of less than about 10 ohms and can pass currents of several amperes.

Disadvantages of the device of FIG. 1 include limited reverse voltage withstand capability and the difficulty of manufacturing the device. The reverse voltage limitation is caused by the electric field which expands from P+ region 214 and terminates sharply on the surface of substrate 210 adjacent the beginning of the N+ region 218. Thus, the device tends to break down at about 200 volts reverse voltage.

The device is also hard to make because the N+ region 218 must be formed by a diffusion step and a mask alignment step which are independent of the self-aligned manufacturing techniques used for making the transistors 212 and 213.

It has been found that the centrally located N+ region 218, which was thought to be necessary to prevent inversion of the N- substrate 210, caused increased electric field near the surface of the device. Moreover, the device required an additional diffusion and masking step in the manufacturing process.

In accordance with this invention, the N+ region 218 is replaced by a floating P+ region 250 which can be formed simultaneously with the formation of the P+ regions 214 and 215. Thus, no additional process steps are necessary for the formation of the central region 250 shown in FIG. 3. Moreover, and in accordance with the invention, the novel concept of the cut in the phosphorus-doped silicon oxide to minimize polarization of this layer and the use of a composite field plate are incorporated in the construction of the TRIMOS device.

Main terminals 226 and 228 are clearly shown in FIG. 2 where the TRIMOS configuration is an elongated ring-shaped configuration, with the region 250 extending in the middle of the section and of the ring-shaped configuration of FIG. 2, as will later be more fully described.

A suitable processing system similar to that, for example, disclosed in copending application Ser. No. 178,689 can be used to form the device, whereby the oxide layer 224 receives thereon polysilicon gate sections 251 and 252. Gates 251 and 252 are skewed out of a common plane as shown to have a relatively close spacing to the underlying channels 220 and 221, respectively, and a greater spacing from the surface where they are removed from the channels. At the time the polysilicon gates 251 and 252 are formed, polysilicon field plates 253 and 254 are also formed. The polysilicon field plates 253 and 254 are shown as stepped members to obtain the benefit of minimizing the curvature of electric field within the body 210 of the chip and to increase the spacing of equipotential lines at the surface of the chip.

Note in FIG. 4, which is a cross-sectional view of the outer periphery of the chip, that there is also provided a P+ guard ring 260 which encircles the outer periphery of the chip. The outermost periphery of the upper surface of the oxide layer 224 then receives a polysilicon field plate 261 which is connected to the N- substrate 210.

In making the device of FIGS. 2, 3 and 4, it is desirable to coat the upper surface of the device with a silox layer 270. The silox layer is a relatively heavily phosphorus-doped silicon oxide layer formed over the full surface of the device. As described in copending application Ser. No. 207,124, however, this silox layer is polarizable by high lateral electric fields which can interfere with the field distribution within the body of device 210. Thus, first and second ring-shaped cuts 290 and 291 are made through the silox-layer and down to the underlying oxide 224 in FIGS. 2 and 3 and on opposite sides of the P+ ring 250. Thus, high voltage, which may appear on either side of the P+ ring 250, will have reduced polarization effects on the silox and thus will cause relatively little effect on the electric field distribution at this area.

In a similar manner, third and fourth cuts 292 and 293, respectively, are made in the silox at the outer pheriphery of the device and on opposite sides of the guard ring 260. These cuts have the same effect on the polarization of the silox layer as the cuts which have been described previously.

It will also be noted that the arrangement of FIG. 3 employs overlapping between polysilicon gates 251 and 252 and the metallizing 225 and 227, respectively. Thus, these components define a stepped electrode insofar as the electric field beneath the stepped electrode is concerned. If desired, the metal electrode 225 in FIG. 4 could more completely overlap the silox layer 270 and the field plate 252 to take full advantage of the benefit of the composite polysilicon field plate and metallizing described in application Ser. No. 207,124.

In the arrangement shown in FIG. 2, the chip is a rectangular chip which could, for example, have dimensions of 100 mils by 150 mils. It will be observed that main terminal 226 has an enlarged region 300 which can serve as a connection region, while terminal 228 similarly has an enlarged region 301 for connection purposes. Similarly, the gates 251 and 252, which are connected internally of the device in a manner not disclosed in FIG. 2, can be provided with the gate connection pads 251 and 252, respectively, shown in FIG. 2 and located on the surfaces of the chip as shown.

Although the present invention has been described in connection with a preferred embodiment thereof, many variations and modifications will now become apparent to those skilled in the art. It is preferred, therefore, that the present invention be limited not by the specific disclosure herein, but only by the appended claims.

What is claimed is:

1. A metal oxide semiconductor type device for switching high voltage and high current circuits; said device comprising a body of semiconductor material of one conductivity type extending to a given depth and having a planar surface; first, second and third spaced regions of the other conductivity type formed in said body and terminating on said planar surface and having depths less than said given depth; said second region disposed between said first and third regions; fourth and fifth regions of said one conductivity type formed within said first and third regions respectively and extending to said planar surface; said first and fourth regions and said third and fifth regions defining respective first and second elongated laterial conduction channels; first and second gate electrodes insulated from and disposed above said first and second conduction channels and operable to invert said conduction channels to control their conductivity; said second region defining a floating guard region.

2. The device of claim 1, wherein said body consists of lightly doped N type silicon material.

3. The device of claim 1 which further includes first main electrode means connected to both said first and fourth regions and second main electrode means connected to both said third and fifth regions.

4. The device of claim 1 or 3 wherein said channels have parallel, elongated paths of closed rectangular shape.

5. The device of claim 4 which further includes a P-N guard ring of said other of said conductivity types formed in the surface containing said channels and enclosing the outer periphery of said device.

* * * * *